United States Patent [19]

Goldberg et al.

[11] Patent Number: 4,728,554

[45] Date of Patent: Mar. 1, 1988

[54] FIBER STRUCTURE AND METHOD FOR OBTAINING TUNED RESPONSE TO HIGH FREQUENCY ELECTROMAGNETIC RADIATION

[75] Inventors: Harris A. Goldberg, Colonia; Y. M. Faruq Marikar, Scotch Plains, both of N.J.

[73] Assignee: Hoechst Celanese Corporation, Somerville, N.J.

[21] Appl. No.: 859,291

[22] Filed: May 5, 1986

[51] Int. Cl.[4] .................... B65D 45/00; H01Q 15/24; H01Q 17/00; H03C 7/00; H05K 9/00

[52] U.S. Cl. .................................... 428/113; 156/63; 244/121; 244/133; 333/21 A; 333/21 R; 342/1; 342/2; 342/3; 342/5; 343/756; 343/897; 343/909; 428/114; 428/229; 428/294; 428/298; 428/329; 428/697

[58] Field of Search ............... 428/113, 114, 229, 294, 428/298, 329, 697; 342/1, 2, 3, 5, 6; 343/756, 897, 909; 156/63

[56] References Cited

U.S. PATENT DOCUMENTS

| | | | |
|---|---|---|---|
| 2,293,839 | 8/1942 | Lindner | 342/1 |
| 2,418,479 | 4/1947 | Pratt et al. . | |
| 2,756,424 | 7/1956 | Lewis et al. | 342/1 |
| 2,771,602 | 11/1956 | Kuhnhold | 342/1 |
| 2,951,247 | 8/1960 | Halpern et al. | 342/1 |
| 2,977,591 | 3/1961 | Tanner | 342/1 |
| 2,992,425 | 7/1961 | Pratt | 342/1 |
| 2,992,426 | 7/1961 | Borcherdt | 342/1 |
| 3,047,860 | 7/1962 | Swallow et al. | 342/5 |
| 3,508,265 | 4/1970 | Ellis | 342/1 |
| 3,526,896 | 9/1970 | Wesch | 342/1 |
| 3,599,210 | 8/1971 | Stander | 342/2 |
| 3,721,982 | 3/1973 | Wesch | 342/1 |
| 3,773,684 | 11/1973 | Marks | 342/2 |
| 3,938,152 | 2/1976 | Grimes et al. | 342/1 |
| 4,003,840 | 1/1977 | Ishina et al. | 342/1 |
| 4,006,479 | 2/1977 | La Combe | 342/1 |
| 4,024,318 | 5/1977 | Forster et al. | 342/1 |
| 4,034,375 | 7/1977 | Wallin | 342/3 |
| 4,162,496 | 7/1979 | Downen et al. . | |
| 4,173,018 | 10/1979 | Dawson et al. | 342/1 |
| 4,538,151 | 8/1985 | Hatakeyama et al. | 342/1 |
| 4,606,848 | 8/1986 | Bond | 252/513 |

FOREIGN PATENT DOCUMENTS

| | | | |
|---|---|---|---|
| 152775 | 7/1986 | Japan | 252/513 |

OTHER PUBLICATIONS

British Intelligence Objectives Sub-Committee Final Report No. 869, Item No. 1, "Ferromagnetic Material for Radar Absorption", declassified Apr. 26, 1960.

*Primary Examiner*—James C. Cannon
*Attorney, Agent, or Firm*—Burns, Doane, Swecker & Mathis

[57] ABSTRACT

The present invention relates to fiber structures and methods for obtaining tuned response to high frequency electromagnetic radiation, particularly at microwave frequencies. In one embodiment, a woven fabric is prepared with ferrite filled fibers oriented perpendicular to dielectric filled fibers. The fill of the fibers is selected to reflect radiation having a known frequency and polarization. In other embodiments, tuned structures are provided by disposing sheets containing oriented ferrite and dielectric fibers parallel to one another and moving the layers relative to one another to achieve the desired impedance for incident radiation.

19 Claims, 8 Drawing Figures

FIBER STRUCTURE AND METHOD FOR OBTAINING TUNED RESPONSE TO HIGH FREQUENCY ELECTROMAGNETIC RADIATION

RELATED APPLICATIONS

This application is related to an application entitled "High Magnetic Permeability Composites Containing Fibers with Ferrite Fill" naming Harris A. Goldberg as inventor.

BACKGROUND OF THE DISCLOSURE

The increasing use of high frequency electromagnetic radiation in radar and communication fields has resulted in the need for materials suitable as radiation absorbers, reflectors, filters and polarizers. Of particular interest are materials which can be impedence matched to the transmission medium and used as covers or outer layers of objects to reduce the radar reflectivity of the objects. For example, there is extensive interest in the use of radar absorbing materials to reduce the radar cross-section of military hardware such as aircraft, missiles, tanks and ships.

The use of radar defeating sheet material is known in the prior art. It has been recognized that conductive fibers can be incorporated in yarns which are knitted into camouflage material to provide a radar reflectance characteristic similar to the surrounding environment. Such a material is disclosed in U.S. Pat. No. 4,064,305 to Wallin. Elsewhere, metallized sheet-form textile materials or parallel metal wires have been disclosed as reflection and polarization control media for microwaves. See U.S. Pat. Nos. 4,320,403 to Ebneth et al and 4,400,701 to Dupressoir. A later Ebneth et al patent (U.S. Pat. No. 4,439,768) discloses the use of multiple layered fabric materials in microwave screening applications in which some of the sheet form material is metalized. Finally, U.S. Pat. No. 4,433,068 to Long et al teaches the use of apparently amorphous polyimide microballons foam with filler to improve microwave absorbing properties. Long et al state that the microwave absorption of polyimides can be modified and improved by the addition of from about 1 to 50 weight percent microwave absorbing material such as graphite powder, ferrites, metal-ceramic compounds such as ferro titanate or mixtures thereof.

There are two commonly used methods of making impedance matched structures. The simplest is to use non-magnetic materials with as low a dielectric constant as possible. If these materials are also employed in a low density structure (such as a foam), the dielectric constant will approach one. The problem with such materials is that they have almost no ability to absorb the incident radiation, and thus will not significantly reduce the reflection from metallic objects which might be behind the low dielectric constant material. The second method for achieving some degree of impedance matching is to use magnetic insulators such as ferrites. These materials can have reasonably high magnetic permeability and electric permitivity as well as significant absorption mechanisms. The major problems with these materials are that they are heavy, their magnetic permeability is frequency dependent and they work best at low microwave frequencies, i.e., at frequencies less than 10 GHz.

In addition, the dielectric constant of such materials is often significantly higher than the magnetic permeability at frequencies of interest. This is primarily because the permeability of the materials decreases rapidly with increasing frequency, while the dielectric constant varies less rapidly with frequency.

Accordingly, it is an object of the present invention to provide a flexible sheet material having a tuned response to high frequency electromagnetic radiation.

It is another object of the present invention to provide impedance matched sheet material having a preselected magnetic permeability and dielectric constant.

It is another object of the present invention to provide a material tuneable to a desired impedance.

These and other objects and features of the claimed invention will be apparent from the following written description and claims, considered with the drawings herein.

SUMMARY OF THE PREFERRED EMBODIMENTS

A preferred embodiment provides a flexible woven fabric having reduced reflectivity to incident, linearly polarized electromagnetic radiation. The fabric includes first fibers having a polymer and from 20 to 80 volume percent particulate ferrite fill and second, non-magnetic dielectric fibers at least partially comprising a polymer. The first fibers are oriented generally parallel to one another and generally aligned with the magnetic field of the incident polarized electromagnetic radiation. The second fibers are woven into the fabric so that they are oriented generally parallel to one another and generally aligned with the electric field of the incident polarized electromagnetic radiation. The first fibers may include more than 30 volume percent ferrite fill and less than 70 volume percent polymer, the polymer being selected from the group consisting of polyvinyl alcohol, polybenzimidizole and polyacrylonitrile. In various aspects of this preferred embodiment, the quantity and fill of the fibers are selected so that the fabric is a tuned absorber of microwaves of a selected frequency and polarization, a tuned polarizer of microwaves reflected by the fabric, or a tuned filter of microwaves of a selected frequency and polarization.

Another preferred embodiment provides an adjustable polarizing filter having a first sheet containing oriented, ferrite particulate filled fibers and a second sheet including oriented, non-magnetic dielectric fibers. The ferrite filled fibers of the first sheet may have a magnetic permeability between 10 and 100 at operating frequencies between 10 MHz and 1000 MHz. Surfaces of the first and second sheets are held adjacent one another so that pricipal planes of the sheets are generally parallel and permit rotation of one sheet with respect to another about an axis normal to the principal planes.

In another preferred embodiment of the invention, a tuneable absorber for microwaves is provided having a first layer including ferrite fibers oriented generally parallel to one another and a second layer overlying the first layer that includes dielectric fibers oriented generally parallel to one another. The second layer is orientable with respect to the first layer to change the angle between the ferrite fibers and the dielectric fibers to impedance match the absorber to a propagation medium from which the microwaves emanate. The microwaves incident to the tuneable absorber have a wavelength which is much greater than the combined thickness of the two layers of fibers. In further aspects of this preferred embodiment, the orientations of the layers are manually adjustable. The ferrite fibers include a polymer and a ferrite fill, and the dielectric fibers include a polymer and a dielectric fill. The amount of ferrite fill in the fibers may be selected to minimize the demagnetization field along the length of the ferrite fibers. Impedance matching in a selected range of microwave frequencies may be accomplished by selecting appropriate values of composition and concentration of the ferrite fill and the fibers. A further aspect of this embodiment provides that the composition and concentration of dielectric fill in the fibers may be selected to minimize the depolarization field along the length of the dielectric fibers.

DETAILED DESCRIPTION OF THE PREFERRED EMBODIMENTS

Preliminary to a discussion of embodiments and examples of the instant invention, the theoretical bases for the invention will be discussed.

The electromagnetic impedance (Z) of a material is given by:

$$Z=(\mu/\epsilon)^{\frac{1}{2}}$$

where $\mu$ is the magnetic permeability and $\epsilon$ is the electric permitivity.

Throughout this application, permeability and permitivity will be treated as measured relative to that of free space. The relative permitivity is also referred to as the dielectric constant.

The reflectivity of a thick piece of material for a wave of normal incidence is given by:

$$R=(1-Z)/(1+Z).$$

To simplify the following theoretical discussions, electromagnetic radiation waves of normal incidence will be considered. However, it is clear that the improved structures described will also be of value in controlling the reflectivity of radiation with non-normal incidence.

Figure 1:
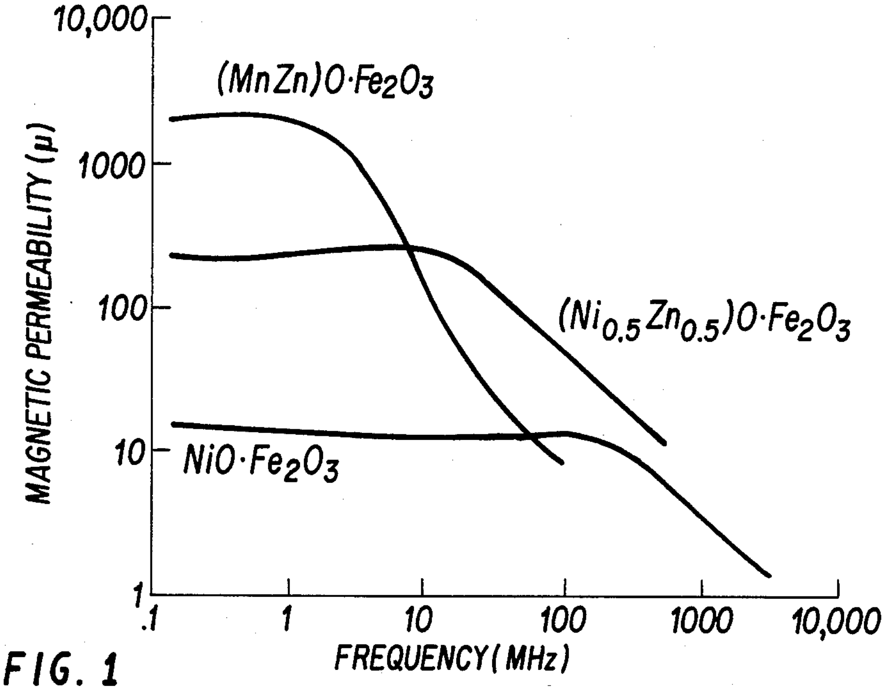
FIG. 1 is a graphical illustration of the variation of magnetic permeability with frequency for three ferrite materials.

Ferrites can be used in impedance matched structures. However, their magnetic permeability is frequency dependent and falls off rapidly above low microwave frequencies, i.e., above 10 GHz. This variation with frequency is shown in FIG. 1 for three ferrite materials: $(MnZn)o.Fe_2O_3$; $(Ni_{0.5}Zn_{0.5})O.Fe_2O_3$; and $NiO.Fe_2O_3$.

In addition, the dielectric constant of such ferrite materials is often significantly higher than the magnetic permeability. This effect is most pronounced at high frequencies, primarily because the permeability is decreasing rapidly with increasing frequency, while the dielectric constant is varying less rapidly with frequency.

This disclosure relates to the use of ferrite and high dielectric constant fibers in oriented structures to make improved impedance matching for linearly polarized radiation over that which could be achieved with the ferrite alone or even by mixing the ferrite and ferroelectric material. In addition, the technique of employing ferrite and high dielectric constant materials in fiber form will lead to simpler design and fabrication of impedance matched structures, even in cases where powder mixtures could be impedance matched.

The approach which is utilized is the minimization of the demagnetizing and depolarizing fields in the fibers incorporated in the fabrics, laminates and composites discussed below. For the purposes of discussion, it is assumed that the fibers are infinitely long, although significant benefits can be achieved with fibers of a short, finite length depending on, inter alia, the aspect ratio of the fibers. However, typically, in fabrics, long individual continuous fibers may be used which extend for the entire length of the fabric.

In order to estimate the effective permeability of an oriented array of fibers (such as a fabric, laminate or composite), the contribution to the magnetic permeability will be separated into that which is due to fibers aligned with the magnetic field and that which is due to fibers oriented perpendicular to the magnetic field. For fibers arranged parallel to the magnetic field H of the incident radiation:

$$(\mu-1)_{eff}=x_{par}(\mu-1), \tag{1}$$

where x is the volume fraction in the structure of the particular fiber. For fibers arranged perpendicular to the H field of the incident radiation:

$$(\mu-1)_{eff}=x_{perp}(\mu-1)/[1+(\mu-1)/2]. \tag{2}$$

Similar results are obtained for the effective dielectric constant for the structure for fibers parallel to the electric field $\epsilon$ of the incident radiation:

$$(\epsilon-1)_{eff}=x_{par}(\epsilon-1). \tag{3}$$

For fibers perpendicular to the E field of the incident radiation:

$$(\epsilon-1)_{eff}=x_{perp}(\epsilon-1)/[1+(\epsilon-1)/2]. \tag{4}$$

A mathematical analysis of the dielectric constants of aligned rods, needles or fibers in a composite is presented in Hale, "The Physical Properties of Composite Materials," 11 *Journal of Materials Science,* pp. 2105, 2112-2113 (1976).

In order to obtain the total effective permeability and dielectric constant for the structure, the contributions from all the fibers in the structure must be added. If fibers are at an angle to the field, the field strengths can be resolved into their parallel and perpendicular components, and then added using the above equations.

Although the above analysis neglects interaction between fibers, it is expected that this will be a good approximation for most oriented structures. This is because in oriented structures with parallel fibers, even when the fibers take up 50% of the volume, the space between fibers is still equal to the thickness of the fibers themselves. Of course, as the fibers get closer together, the importance of the demagnetization effects (as given in equations (2) and (4)) will be reduced. In unoriented composites, it is expected that demagnetization effects will be important at all concentrations below the percolation threshold. The percolation threshold ($x_c$) will depend on the aspect ratio of the filler as well as the wetting of the filler by the matrix material. Since the purpose of using fibers as a filler is to reduce the demagnetization effects, fiber filler will be better than powder filler at any concentration below the percolation threshold for a powder filled composite. This is typically in the range of 15–30% by volume.

Figure 2:
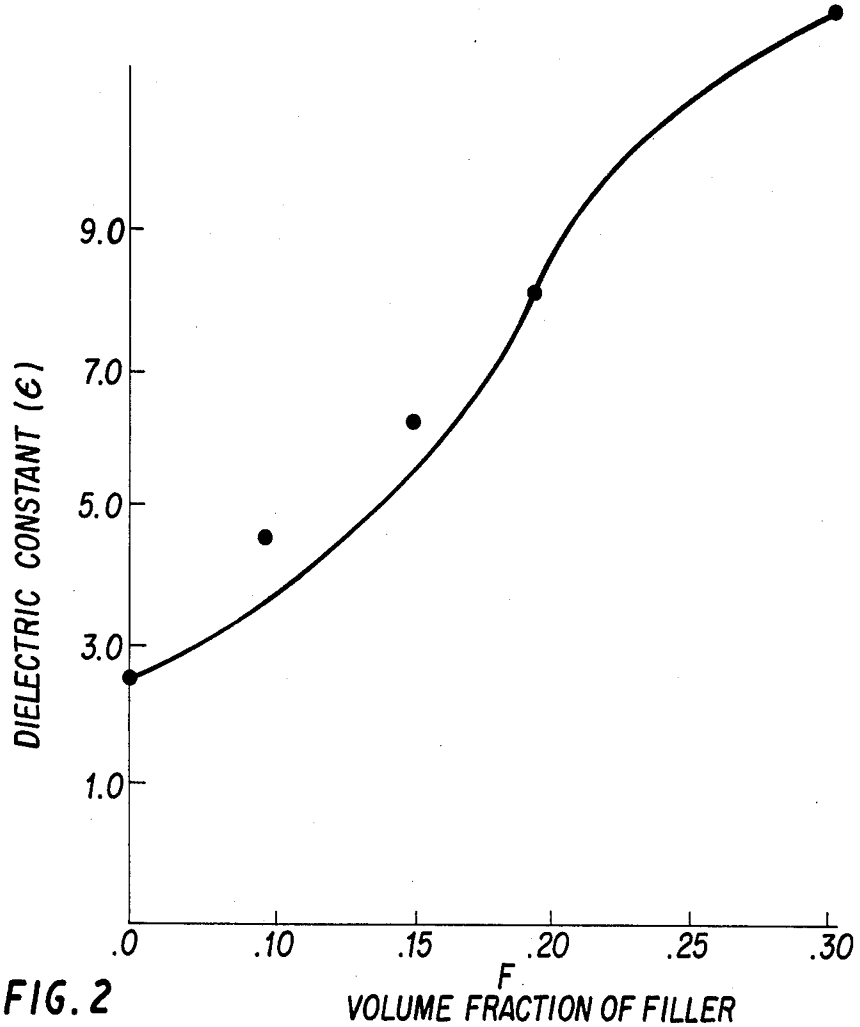
FIG. 2 is a graphical illustration of the dielectric constant of a filled epoxy as a function of the volume fraction of the filler.

This demagnetization effect is illustrated for the analogous case of the dielectric constant of a filled epoxy in FIG. 2. FIG. 2 is a graph of the dielectric constant of a PZT (lead-zirconium titanate) filled epoxy as a function of the volume fraction of the filler. The data was taken at between 2 and 18 GHz and was essentially independent of frequency. The graph suggests a diminishing return for addition of PZT material to the composite, which is attributed to a passing of the percolation threshold at which depolarization effects begin to reduce the effectiveness of the fill. An analogous effect is expected in the magnetic case when fiber volume concentration in the matrix exceeds about 30%.

Figure 3:
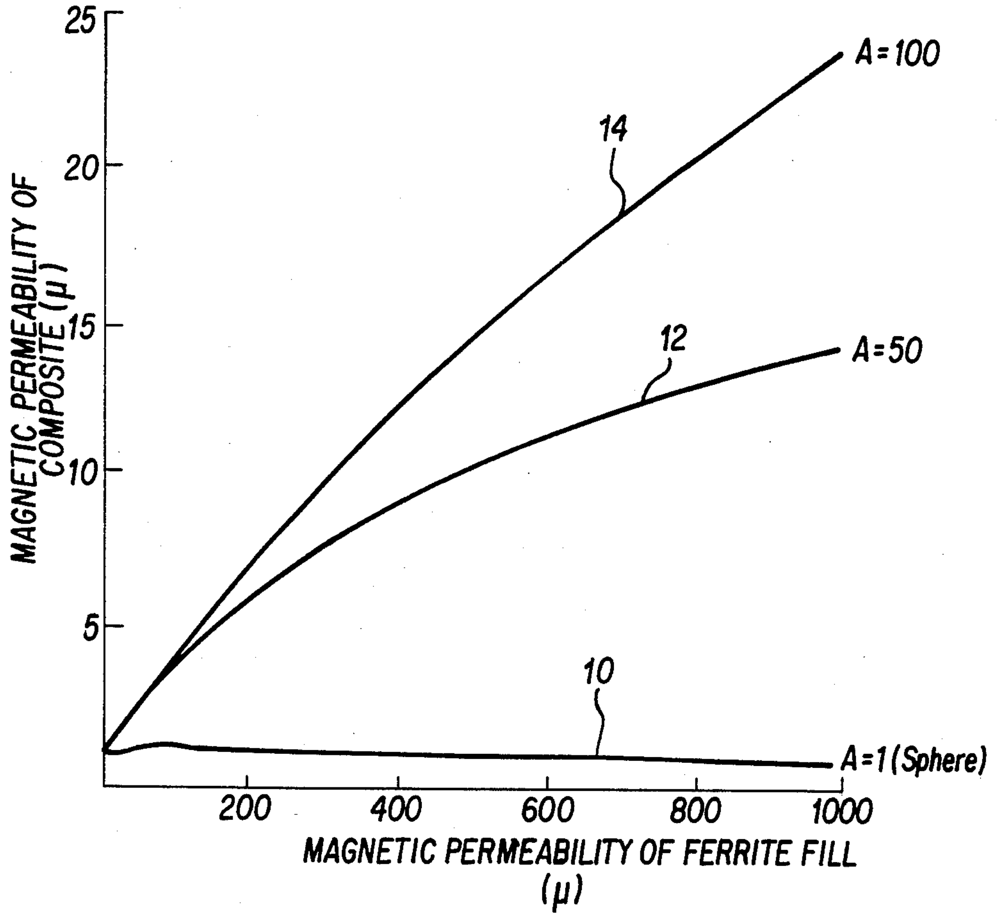
FIG. 3 is a graphical illustration of the effects of fiber aspect ratio on the magnetic permeability of a composite containing ferrite fiber fill.

It is expected that effects indicated in equations (1) and (3) are dependent on the aspect ratio of the involved fibers. The aspect ratio A of a fiber of generally circular cross-section may be expressed as $$A = l/d \tag{5}$$

where l is the length of the fiber and d is the diameter of the fiber. The expected dependency of the composite magnetic permeability on aspect ratio is depicted in FIG. 3. Three plots are shown. Plot 10 is for a composite of 10% spherical ferrite particulates dispersed in a non-magnetic composite matrix material. Plots 12 and 14 are for a composite of 10% ferrite fibers aligned in a non-magnetic composite matrix material having aspect ratios of 50 and 100, respectively. It will be observed from the figure that it is expected that higher magnetic permeability ferrites will impart this characteristic to the composite to a greater extent if incorporated into fibers having larger aspect ratios. In contrast, the use of a spherical particulate fill of high magnetic permeability imparts very little of this characteristic to the composite as a whole.

This effect has been verified experimentally by comparing a composite made with a powdered ferrite fill with a composite including sintered ferrite rods made of the same ferrite material. In the experiment, unsintered nickel zinc ferrite was dispersed in the epoxy matrix material at about a 10% volume concentration to make a first composite. The same nickel zinc ferrite powder was sintered into rods approximately ¼ inch in length and having an aspect ratio of about 50. An alternative method of making pure ceramic ferrite fibers is disclosed in U.S. Pat. No. 2,968,622 to Whitehurst, which is hereby incorporated by reference. The rods were placed at about a 10% volume concentration in the same epoxy matrix to make a second composite. Measurements of the magnetic permeability of the composites are tabulated below.

TABLE I

| Frequency | First (Powder) Composite Magnetic Permeability | Second (Rod) Composite Magnetic Permeability |
|---|---|---|
| 100 MHz | 1.3 | 1.8 |
| 1 GHz | 1.3 | 1.4 |
| 10 GHz | .9 | .9 |

The data indicates the effectiveness of the elongated ferrite configuration (i.e., rods having an aspect ratio on the order of 50) in the lower frequency regimes. As expected, the effect diminishes in high frequency regimes because of the decrease in intrinsic permeability of the nickel zinc ferrite used here.

Because of the inflexibility of the sintered rods and the difficulty of preparing them with very large aspect ratios, in many applications it may be desirable to employ, in their place, fibers made of ferrite filled polymer. Methods of producing ferromagnetic spinel fibers by spinning a composition comprising a fluid organic polymer medium and a particulate ferrite are disclosed in U.S. Pat. No. 4,541,973 to Arons, the contents of which are incorporated by reference herein.

The following examples are further illustrative of the preferred embodiments. The specific ingredients and processing parameters are presented as being typical and various modifications may be derived in view of the foregoing disclosure within the scope of the invention.

EXAMPLE 1

Figure 4:
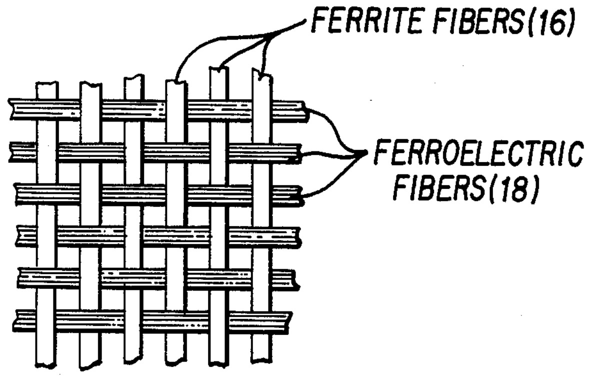
FIG. 4 is a pictorial diagram of a fabric woven from ferrite and ferroelectric fibers.

An oriented woven structure comprises a first polyvinylalcohol (PVA) fiber which contains 40 volume percent nickel ferrite particulates and a similar polyvinyl fiber filled with a non-magnetic dielectric fill, 40 volume percent particulate PZT (lead-zirconium titanate). The two fibers are woven into a fabric as shown if FIG. 4 so that the ferrite fibers (16) are approximately parallel to one another and approximately perpendicular to the ferroelectric fibers (18). The permeability of the ferrite particulates is 100 near 100 megahertz, and the permeability of the PVA fiber made therefrom is 10. The effective dielectric constant of the ferrite filled PVA is 20. The ferrite filled fibers take up 25% of the volume of the fabric. The PZT filled PVA fibers have an effective dielectric of 10. The PZT filled fibers are woven perpendicular to the ferrite filled fibers and take up 20% of the volume of the structure. The effective dielectric constant for this structure when the electric field is parallel to the PZT filled fibers is expected to be 3.252, while the effective permeability of the structure when the magnetic field is parallel to the ferrite filled fibers is expected to be 3.25. The impedance relative to free space is thus 0.9995, and the reflectivity for the above-described polarization is 0.00037 (or −68.7 decibels). The relative impedance of the ferrite filled fibers is 0.71, and a completely dense structure made from those fibers is expected to have a reflectivity of 0.17 (or −15.4 decibels). Thus, a significant reduction in the reflectivity is expected to be achieved by combining these fibers in an oriented structure with PZT filled fibers. It is important to note that since the ferrite filled material has a dielectric constant which is higher than its magnetic permeability, there is no way the reflectivity of the material could be reduced by adding dielectric material in an isotropic structure. Of course, the reduced reflectivity is observed for one linear polarization of incident radiation. The reflectivity for the opposite polarization is expected to be 0.35, i.e., higher than that which would be obtained from a similar isotropic material.

EXAMPLE 2

The same fibers are employed as in Example 1. However, they are not woven into a single oriented fabric, but are held in separate layers or sheets. All layers containing ferrite filled fibers are kept in one orientation, while all layers with PZT filled fibers are kept in another orientation.

Figure 5:
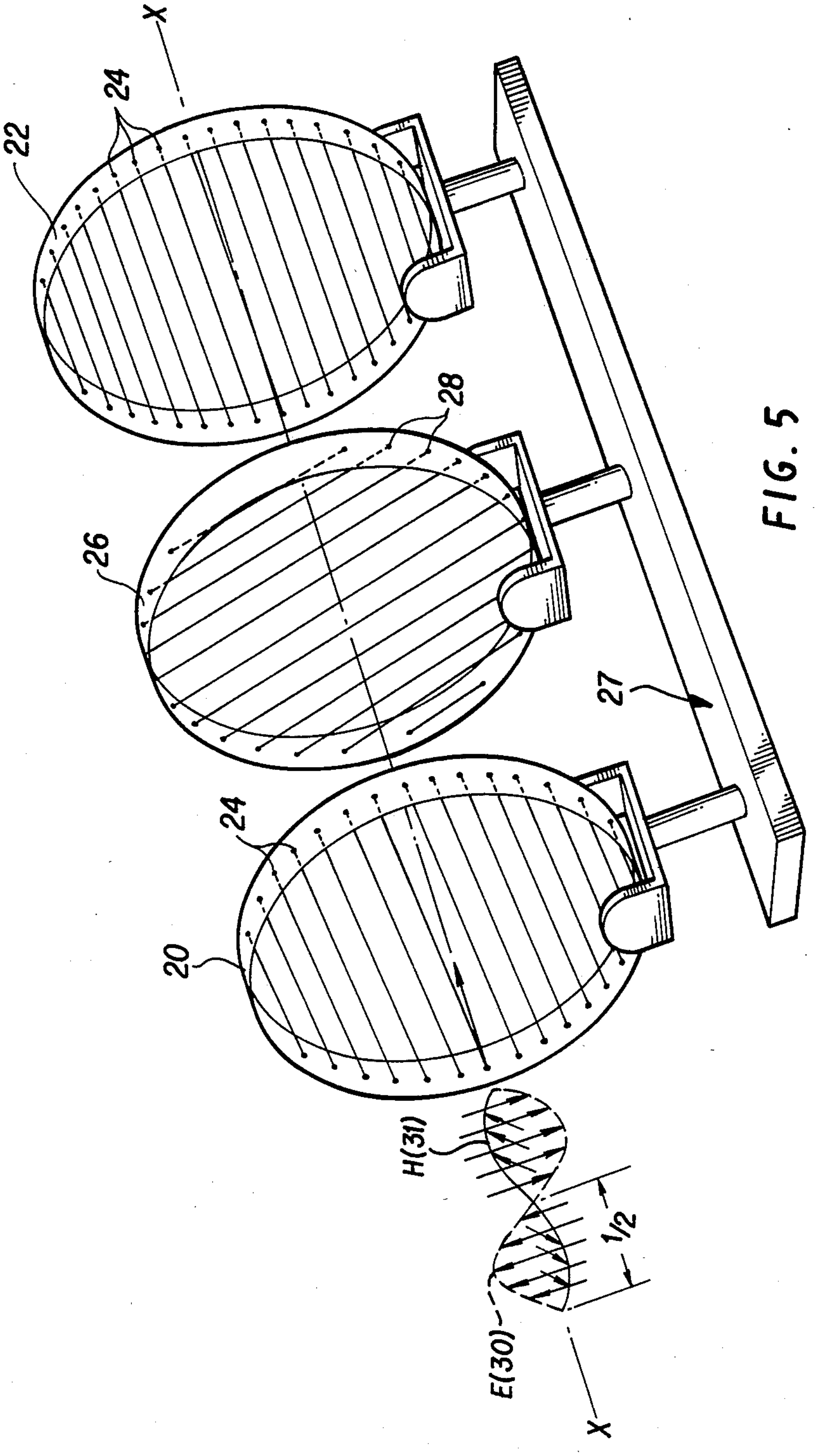
FIG. 5 is a pictorial diagram of a multilayer impedance matching device.

For example, as shown in FIG. 5, one or more sheets, such as sheets 20 and 22 containing ferrite fibers 24, may be provided, the fibers in the one or more sheets being oriented parallel to one another. One or more additional sheets such as sheet 26 may be provided containing ferroelectric fibers 28, oriented parallel to one another. The orientation of the two types of fibers can be changed by independently rotating the sheets. The structure for supporting and rotating the sheets may be similar to that of an air capacitor commonly found in radio and TV tuners. A structure for holding the sheets 22, 24 and 26 so that their principal planes are generally parallel to one another and so that the sheets may be rotated about an axis x—x is indicated at 27. In FIG. 5, the distances between the sheets is exagerated for clarity. In practice, the sheets may be disposed in sliding contact with one another.

The advantage of being able to adjust the relative orientation of the two types of fibers will be apparent: Changes in working frequency will lead to changes in the magnetic permeability of the ferrite filled material; and these changes can be compensated for by changing the angle between the fibers and the electric field 30 and/or magnetic field 31 of the incident radiation. For example, if the incident radiation increases in frequency from 100 MHZ to 200 MHZ, the permeability of the ferrite filled fibers will drop to 8, resulting in an effective permeability of 2.75 for a sheet having 25 volume percent of such fibers. If the ferroelectric sheet contains 20 volume percent of the ferroelectric fibers (as in Example 1), then it is expected that the decrease in permeability can be compensated for by rotating the sheet 26 about axis x—x so that the ferroelectric fibers lie at a 55 degree angle with respect to the electric field 30. Thus, this novel structure can be used to maintain very low reflectivity for polarized waves even when the material properties are changing with frequency. Other changes in material properties such as those due to temperature variations could also be compensated for by rotation of the oriented layers.

EXAMPLE 3

Ferrite filled PVA fiber with a permeability of 12 and a dielectric constant of 6 is mixed with PZT filled PVA fiber with a dielectric constant of 30 in a ratio of 7 ferrite filled fibers to 1 PZT filled fiber. The resulting yarn is then woven into an isotropic fabric (same structure in both warp and weave directions). This fabric will be impedance matched at all polarizations. If the ferrite filled fiber volume fraction is 50% (i.e., 25% for the fibers in each direction), then the effective permeability is expected to be 3.75, while the dielectric constant is expected to be 3.71, and the reflectivity will be 0.0054 (or −45 decibels). The reflectivity of the ferrite filled fibers without the PZT fibers is expected to be 0.17.

EXAMPLE 4

Chopped fibers with properties similar to those of Example 3 are put in a low density, low dielectric constant matrix. The addition of one part PZT filled fibers to the ferrite fiber filler again significantly reduces the reflectivity. The aspect ratio need only be above 20 for the theory described above to be useful in designing this impedance matched fabric.

The unoriented dispersion of high aspect ratio magnetic or dielectric material in a low dielectric constant matrix will raise the magnetic permeability and/or dielectric constant of the matrix by a larger amount than would be achieved if the same amount of similar material was added in powder form.

If one wants to increase the dielectric constant of a polymer, it is also well known that one can add a high dielectric constant filler material. Similarly, magnetic material can be added in order to increase the magnetic permeability of the polymer. The novel result is that one can obtain larger increases in the dielectric constant and/or magnetic permeability of a composite by using filler material in fiber form. This enhancement occurs below the percolation threshold for the fiber in the composite matrix and is due entirely to the reduction of demagnetization and depolarization effects when fibers are used.

Figure 6A:
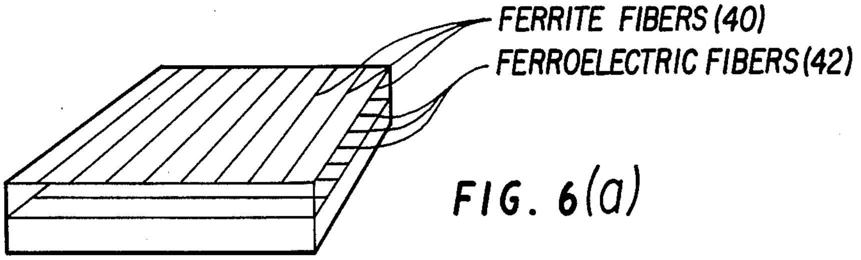
FIG. 6(*a*), (*b*) and (*c*) are examples of composites containing ferrite and ferroelectric fibers.
Figure 6B:
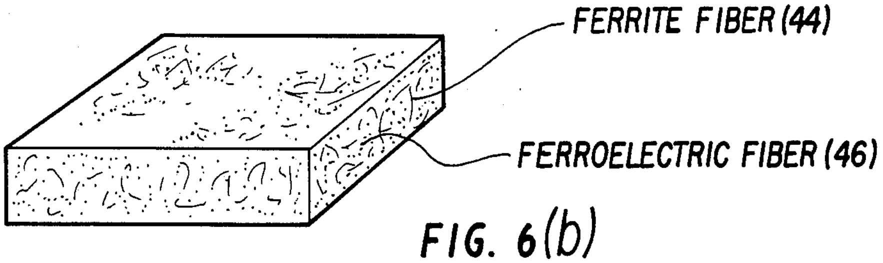
Figure 6C:
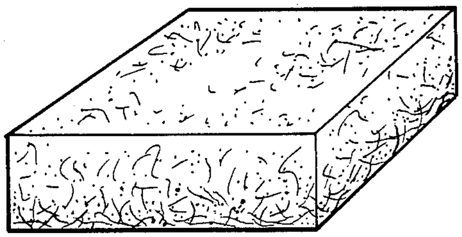

Examples of such structures are shown in FIGS. 6(*a*), 6(*b*) and 6(*c*). In FIG. 6(*a*), parallel ferrite fibers 40 in one orientation are composited with parallel ferroelectric 42 fibers in a perpendicular orientation. In FIG. 6(*b*), a composite is shown having a random dispersal of both ferrite fibers 44 and ferroelectric fibers 46. FIG. 6(*c*) illustrates a graded composite in which ferrite fibers and/or ferroelectric fibers are dispersed in a composite so that the fiber concentration is a function of the depth in the composite.

The disclosure indicates how selected values of magnetic permeability and/or selected dielectric constant can be achieved in oriented and unoriented fabrics or composites while minimizing the use of expensive magnetic and/or dielectric filler materials, whose addition, in large quantities to the composites or filaments, might otherwise degrade the mechanical, thermal or electrical properties of the resulting fabrics or composites. Moreover, the disclosure teaches novel impedance matched or tuneable sheet material which may be made from such fabrics and composites.

Although the invention has been described with preferred embodiment, it is to be understood that variations and modifications may be resorted to as will be apparent to those skilled in the art. Such variations and modifications are to be considered within the purview and the scope of the claims appended hereto.

What is claimed is:

1. A flexible woven fabric having reduced reflectivity to incident, linearly polarized electromagnetic radiation, said fabric comprising:

first fibers comprising a polymer and from 20 to 80 volume percent particulate ferrite fill, said first fibers being oriented generally parallel to one another and generally aligned with the magnetic field of said incident polarized electromagnetic radiation; and second, non-magnetic dielectric fibers at least partially comprising a polymer, said second fibers being woven in said fabric so that said second fibers are oriented generally parallel to one another and generally aligned with the electric field of said incident polarized electromagnetic radiation.

2. The fabric of claim 1 wherein said first fibers comprise less than 70 volume percent polymer and greater than 30 volume percent ferrite fill.

3. The fabric of claim 2 wherein the polymer is selected from the group consisting of polyvinyl alcohol, polybenzimidazole and polyacrylonitrile.

4. The fabric of claim 1 wherein the ferrite fill is spinel particulates, said spinel particulates corresponding to the formula $$MFe_2O_4$$

wherein M is manganese, iron, cobalt, nickel, copper, zinc, cadmium, magnesium, barium, strontium, or any combination thereof.

5. The fabric of claim 1 wherein the quantity and fill of said fibers are selected so that the fabric is a turned absorber of microwaves of a selected frequency and polarization.

6. The fabric of claim 1 wherein the quantity and fill of said fibers are selected so that the fabric is a tuned polarizer of microwaves reflected by the fabric.

7. The fabric of claim 1 wherein the quantity and fill of said fibers are selected so that the fabric is a tuned filter of microwaves of a selected frequency and polarization.

8. A tunable absorber for microwaves comprising:

a first layer including ferrite fibers oriented generally parallel to one another; and a second layer overlying said first layer including dielectric fibers oriented generally parallel to one another, said second layer being orientable with respect to said first layer to change the angle between the ferrite fibers and the dielectric fibers to impedance match the absorber to a propagation medium from which the microwaves emanate;

wherein the wavelength of the microwaves is much greater than the combined thickness of the layers.

9. The tunable absorber of claim 8 wherein the frequency of said microwaves is from 300 MHz to 10 GHz.

10. The tunable absorber of claim 9 wherein the orientations of the layers are adjustable.

11. The tunable absorber of claim 10 wherein the ferrite fibers comprise a polymer and a ferrite fill and wherein the dielectric fibers comprise a polymer and a dielectric fill.

12. The tunable absorber of claim 11 wherein the amount of ferrite fill in the fibers is selected to minimize the demagnetization field along the length of the ferrite fibers.

13. The tunable absorber of claim 12 wherein the composition and concentration of the ferrite fill in the fibers is selected to provide impedance matching in a selected range of microwave frequencies.

14. The tunable absorber of claim 11 wherein the composition and concentration of dielectric fill in the fibers is selected to minimize the depolarization field along the length of the dielectric fibers.

15. The tunable absorber of claim 8 wherein the first layer is a composite film including the ferrite fibers and a binder, and wherein the second layer is a composite film including the dielectric fibers and a binder.

16. The tunable absorber of claim 15 wherein a dimension of a principal plane of said films is larger than one wavelength of the microwave.

17. A method for impedance matching an object to a medium of propagation of incident microwave energy comprising:

disposing at least one layer containing parallelized ferrite fibers on a surface of the object;

disposing at least one layer containing parallelized dielectric fibers on the surface of the object; and moving the layers relative to one another to adjust an angle between said ferrite fibers and said dielectric fibers.

18. An adjustable polarizing filter comprising:

a first sheet containing oriented, ferrite particulate filled fibers, said ferrite filled fibers having a magnetic permeability between 10 and 100 at operating frequencies between 10 MHz and 1000 MHz;

a second sheet including oriented non-magnetic, dielectric fibers; and means for holding surfaces of the first and second sheets adjacent one another so that principal planes of the sheets are generally parallel and permitting rotation of one sheet with respect to another about an axis normal to the principal planes.

19. The adjustable polarizing filter of claim 18 wherein said ferrite filled fibers have an aspect ratio of at least 50.

* * * * *